US011177110B2

United States Patent
Hayworth et al.

(10) Patent No.: US 11,177,110 B2
(45) Date of Patent: Nov. 16, 2021

(54) VOLUME SCANNING ELECTRON MICROSCOPY OF SERIAL THICK TISSUE SECTIONS WITH GAS CLUSTER MILLING

(71) Applicant: Howard Hughes Medical Institute, Ashburn, VA (US)

(72) Inventors: Kenneth J. Hayworth, Ashburn, VA (US); Harald F. Hess, Leesburg, VA (US); C. Shan Xu, Ashburn, VA (US); David Peale, Ashburn, VA (US)

(73) Assignee: Howard Hughes Medical Institute, Ashburn, VA (US)

( * ) Notice: Subject to any disclaimer, the term of this patent is extended or adjusted under 35 U.S.C. 154(b) by 0 days.

(21) Appl. No.: 16/269,256

(22) Filed: Feb. 6, 2019

(65) Prior Publication Data

US 2019/0355550 A1 Nov. 21, 2019

Related U.S. Application Data

(60) Provisional application No. 62/801,509, filed on Feb. 5, 2019, provisional application No. 62/629,501, filed
(Continued)

(51) Int. Cl.
*H01J 37/26* (2006.01)
*G01N 23/2251* (2018.01)
*H01J 37/32* (2006.01)

(52) U.S. Cl.
CPC ........ *H01J 37/261* (2013.01); *G01N 23/2251* (2013.01); *H01J 37/3244* (2013.01); *H01J 2237/006* (2013.01); *H01J 2237/0812* (2013.01)

(58) Field of Classification Search
CPC .. H01J 37/261; H01J 37/3053; H01J 37/3005; H01J 37/3244; H01J 2237/006; H01J 2237/0812; G01N 23/2251
See application file for complete search history.

(56) References Cited

U.S. PATENT DOCUMENTS 7,235,410 B2 * 6/2007 Chen ................. H01L 21/32051
438/4
7,253,410 B1 * 8/2007 Bertsche ............... H01J 37/026
250/307
(Continued)

FOREIGN PATENT DOCUMENTS

| EP | 2995924 A1 | 3/2016 |
| WO | 2012155267 A1 | 11/2012 |
| WO | 2018140903 A2 | 8/2018 |

OTHER PUBLICATIONS

Horstmann et al, "Serial Section Scanning Electron Microscopy (S3EM) on Silicon Wafers for Ultra-Structural Volume Imaging of Cells and Tissues", PlOS ONE, Apr. 2012, vol. 7, Issue 4 (Year: 2012).*

(Continued)

*Primary Examiner* — David E Smith
(74) *Attorney, Agent, or Firm* — Brake Hughes Bellermann LLP (57) ABSTRACT

A microscopy system includes a gas cluster beam system configured for generating a beam of gas clusters directed toward a sample to irradiate a sample and mill away successive surface layers from the sample, a scanning electron microscope system configured for irradiating the successive surface layers of the sample with an electron beam and for imaging the successive surface layers of the sample in response to the irradiation of the surface layer, and a processor configured for generating a three dimensional image of the sample based on the imaging of the successive layers of the sample.

44 Claims, 6 Drawing Sheets

Related U.S. Application Data on Feb. 12, 2018, provisional application No. 62/627,000, filed on Feb. 6, 2018.

(56) References Cited

U.S. PATENT DOCUMENTS

| | | | | |
|---|---|---|---|---|
| 8,629,393 | B1* | 1/2014 | Kirkpatrick | H01J 37/05 250/251 |
| 9,852,750 | B2* | 12/2017 | Nadeau | G11B 5/3163 |
| 2002/0014407 | A1* | 2/2002 | Allen | H01L 21/67069 204/298.36 |
| 2006/0043317 | A1* | 3/2006 | Ono | H01J 37/3053 250/492.21 |
| 2011/0300599 | A1 | 12/2011 | Khoury et al. | |
| 2014/0226003 | A1* | 8/2014 | Phaneuf | H01J 37/3005 348/80 |
| 2015/0036122 | A1* | 2/2015 | Edelmann | G02B 21/34 356/72 |
| 2015/0243477 | A1* | 8/2015 | Stone | H01J 37/3007 250/310 |
| 2015/0243478 | A1* | 8/2015 | Lee | H01J 37/3056 204/192.11 |
| 2016/0079035 | A1* | 3/2016 | Passey | G01N 1/286 250/492.3 |
| 2017/0084423 | A1* | 3/2017 | Masnaghetti | H01J 37/28 |

OTHER PUBLICATIONS

Hayworth et al., "Ultrastructurally-Smooth Thick Partitioning and Volume Stitching for Larger Scale Connectonomics", Nat Methods Apr. 2015; 12(4); 319-322 (Year: 2015). (Year: 2015).*
(Horstmann et al, "Serial Section Scanning Electron Microscopy (S3EM) on Silicon Wafers for Ultra-Structural Volume Imaging of Cells and Tissues", PLoS ONE, Apr. 2012, vol. 7, Issue 4 (Year: 2012).*
Hayworth et al., "Ultrastructurally-Smooth Thick Partitioning and Volume Stitching For Larger Scale Connectomics", Nat Methods Apr. 2015; 12(4); 319-322 (Year: 2015).*
Aoki, et al., "Molecular dynamics simulations of surface smoothing and sputtering process with glancing-angle gas cluster ion beams", Nuclear Instruments and Methods in Physics Research Section B: Beam Interactions with Materials and Atoms, vol. 257, Issues 1-2, 2007, pp. 645-648.
Bock, et al., "Network anatomy and in vivo physiology of visual cortical neurons", Nature, vol. 471, ,, Mar. 10, 2011, pp. 177-182.
Calcagno, et al., "Structural modification of polymer films by ion irradiation", Nuclear Instruments and Methods in Physics Research Section B: Beam Interactions with Materials and Atoms, vol. 65, Issues 1-4, Mar. 1992, pp. 413-422.
Choi, et al., "Interregional synaptic maps among engram cells underlie memory formation", Science 360, Apr. 27, 2018, pp. 430-435.
Denk, et al., "Serial block-face scanning electron microscopy to reconstruct three-dimensional tissue nanostructure", PLoS biology, vol. 2, Issue 11, e329, Nov. 2004, pp. 1900-1909.
Eberle, et al., "High-resolution, high-throughput imaging with a multibeam scanning electron microscope", Journal of microscopy, vol. 259, Issue 2, 2015, pp. 114-120.
Hayworth, et al., "Imaging ATUM ultrathin section libraries with WaferMapper: a multi-scale approach to EM reconstruction of neural circuits", Frontiers in neural circuits, vol. 8, Article 68, Jun. 2014, 18 pages.
Hayworth, et al., "Ultrastructurally smooth thick partitioning and volume stitching for large-scale connectomics", Nature methods, vol. 12, Apr. 2015, pp. 319-322.
Holtmaat, et al., "Experience-dependent structural synaptic plasticity in the mammalian brain", Nature Reviews Neuroscience, vol. 10, Sep. 2009, pp. 647-658.
Horstmann, et al., "Serial section scanning electron microscopy (S3EM) on silicon wafers for ultra-structural volume imaging of cells and tissues", PLoS One, vol. 7, Issue 4, e35172, Apr. 2012, 8 pages.
Hoshiba, et al., "Synaptic Ensemble Underlying the Selection and Consolidation of Neuronal Circuits during Learning", Frontiers in neural circuits, vol. 11, Article 12, Mar. 2017, 11 pages.
Januszewski, "High-precision automated reconstruction of neurons with flood-filling networks", Nature methods 15(8), Jul. 2018, pp. 605-610.
Kasai, et al., "Structure-stability-function relationships of dendritic spines", Trends in neurosciences, vol. 26, No. 7, Jul. 2003, pp. 360-368.
Kornfeld, et al., "Progress and remaining challenges in high-throughput volume electron microscopy", Current opinion in neurobiology, 50, 2018, pp. 261-267.
Lamprecht, et al., "Structural plasticity and memory", Nature Reviews Neuroscience, vol. 5, Jan. 2004, pp. 45-54.
Malloy, et al., "Massively parallel E-beam inspection: enabling next-generation patterned defect inspection for wafer and mask manufacturing", Proc. SPIE 9423, Alternative Lithographic Technologies VII, 942319, Mar. 2015, 11 pages.
Poo, et al., "What is memory? The present state of the engram", BMC Biology 14, 2016, 18 pages.
Rading, et al., "Dual beam depth profiling of polymer materials: comparison of C60 and Ar cluster ion beams for sputtering", Surface and Interface Analysis, vol. 45, Issue 1, Jul. 2012, pp. 171-174.
Titze, "echniques to prevent sample surface charging and reduce beam damage effects for SBEM imaging", Doctoral dissertation, 2013, 112 pages.
Xu, et al., "Enhanced FIB-SEM systems for large-volume 3D imaging", Elife, 2017, 36 pages.
Hall Barrientos, et al., "Fabrication and characterisation of drug-loaded electrospun polymeric nanofibers for controlled release in hernia repair", International Journal of Pharmaceutics, vol. 517, No. 1, pp. 329-337, Dec. 14, 2016, XP029878133.
Hayworth, et al., "Serial Thick Section Gas Cluster Ion Beam Scanning Electron Microscopy", Microscopy and Microanalysis, vol. 24, No. S1, pp. 1444-1445, Aug. 2018, XP055582055.
International Search Report and Written Opinion for International Application No. PCT/US2019/016871, dated May 2, 2019, 19 pages.
Kakuta, et al., "Low damage smoothing of magnetic materials using off-normal gas cluster ion beam irradiation", Surface and Coatings Technology, vol. 201, No. 19-20, pp. 8632-8636, Jul. 20, 2007, XP022161902.
Kim, et al., "Auger electron nanoscale mapping and x-ray photoelectron spectroscopy combined with gas cluster ion beam sputtering to study and organic bulk heterojunction", Applied Physics Letters, vol. 104, No. 24, Jun. 16, 2014, XP012186708.

* cited by examiner

VOLUME SCANNING ELECTRON MICROSCOPY OF SERIAL THICK TISSUE SECTIONS WITH GAS CLUSTER MILLING

CROSS-REFERENCE TO RELATED APPLICATIONS

This application is a non-provisional of, and claims priority under 35 U.S.C § 119 to, U.S. Provisional Patent Application No. 62/627,000, filed on Feb. 6, 2018, entitled "VOLUME SCANNING ELECTRON MICROSCOPY OF SERIAL THICK TISSUE SECTIONS WITH GAS CLUSTER ION MILLING," and to U.S. Provisional Patent Application No. 62/629,501, filed on Feb. 12, 2018, entitled "VOLUME SCANNING ELECTRON MICROSCOPY OF SERIAL THICK TISSUE SECTIONS WITH GAS CLUSTER MILLING," and to U.S. Provisional Patent Application No. 62/801,509, filed on Feb. 5, 2019, entitled "SERIAL THICK-SECTION GAS CLUSTER ION BEAM SCANNING ELECTRON MICROSCOPY," the disclosures of which are incorporated herein in their entireties.

BACKGROUND

Many modalities of electron microscopy (EM) can probe cellular structure at the nanometer scale. However, despite considerable progress over the past decade in developing high-resolution three-dimensional (3D) imaging, there remain important limitations reflecting an inherent trade-off between resolution and the size of the 3D volume. For demanding applications such as tracing neuronal processes, high resolution in the z axis, parallel to the direction of the electron beam of the electron microscope, in addition to the xy plane, is critical. Focused Ion Beam Scanning Electron Microscopy (FIB-SEM) offers this capability, with xy and z resolution all <10 nm. FIB-SEM can generate 3D images with superior z-axis resolution, yielding data with isotropic voxels that is therefore more readily interpretable than available with other techniques.

However, previous FIB-SEM approaches have needed to use a focused beam of ions (e.g., gallium ions) traveling at high energy to remove a few nanometers of surface tissue. To do so the FIB-SEM's ion beam is directed at a very shallow 'glancing' angle (<1°) to the sample surface. For various reasons, such 'glancing' angle ion milling restricts the surface area over which smooth FIB milling can occur to ~50 microns in the direction of travel of the ion beam.

A related technique of broad area ion milling can also remove the surface in few nm increments (in a 'z' direction) over larger areas but suffers from non-uniformity of the milling rate across the surface. This can be quite pronounced not only from the intrinsic roughness that the ion milling action generates but also from inherently inhomogeneous samples (with spatially varying milling rates) such as stained biological samples embedded in resins. These milling fluctuations are further exacerbated and accumulate as one tries to mill larger samples over z distances greater than 10 microns potentially up to several millimeter depths. A 10% milling non-uniformity translates to errors of one micron to hundreds of microns in the z position of the image, which is catastrophic for 3D image acquisition where much smaller, e.g. <20 nanometer, voxels are used.

SUMMARY

In a general aspect, a microscopy system includes a gas cluster beam system configured for generating a beam of gas clusters directed toward a sample to irradiate a sample and mill away successive surface layers from the sample, a scanning electron microscope system configured for irradiating the successive surface layers of the sample with an electron beam and for imaging the successive surface layers of the sample in response to the irradiation of the surface layer, and a processor configured for generating a three dimensional image of the sample based on the imaging of the successive layers of the sample.

Implementations can include one or more of the following features, alone or in combination with each other. For example, gas clusters in the beam include more than 100 atoms per cluster, or more than 1000 atoms per cluster.

The beam of gas clusters can be directed toward the sample at an angle of greater than 10 degrees to the surface of the sample. The beam of gas clusters can be directed toward the sample at an angle of greater than 10 degrees and less than 80 degrees to the surface of the sample. The beam of gas clusters can be directed toward the sample at an angle of greater than 20 degree and less than 45 degrees to the surface of the sample.

The gas cluster beam system can include a vacuum system through which the beam of gas clusters is directed toward the sample, the vacuum system including residual gas molecules that, during a collision with a gas cluster of the beam of gas clusters, can break the gas cluster into two or more subclusters, where a subcluster includes one or more atoms of the original cluster. The energy of gas clusters in the beam of gas clusters can be such that the average energy of an atom in a gas cluster in the beam is greater than the energy required to remove an atom from a surface layer of the sample. The energy of individual atoms in the gas clusters in the beam of gas clusters can be between 0.2 and 20 eV. The energy of gas clusters in the beam of gas clusters can be such that the average energy of an atom in a gas cluster in the beam is between one to five times the energy required to remove an atom from a surface layer of the sample.

The scanning electron microscope system can be configured for irradiating the successive surface layers of the sample with a plurality of electron beams and for imaging the successive surface layers of the sample in response to the irradiation of the surface layer by the multiple electron beams. The system can include a stage supporting the sample, where the stage is configured to rotate the sample about an axis different from an axis of the gas cluster ion beam.

The sample can be cut into a plurality of sections that are loaded onto a substrate. The gas cluster ion beam system can be configured for generating a beam of gas clusters for irradiating the plurality of sections to mill away successive surface layers from the sections simultaneously. The gas cluster ion beam system can be configured for scanning the beam of gas clusters over the sections. The scanning electron microscope system can be configured for irradiating the successive surface layers of the sample with a plurality of electron beams and for imaging the successive surface layers of the sample in response to the irradiation of the surface layer by the multiple electron beams. Each section is less than 50 microns thick. The processor can be configured for generating a three dimensional image of the sample based on the imaging of the successive layers of the sample.

The beam of gas clusters can include neutral gas clusters.

The sample can be cut into a plurality of sections that each are milled into a plurality of surface layers by the beam of gas clusters and whose plurality of surface layers are imaged in response to the irradiation by the electron beam, and the processor can be further configured for generating the three dimensional image of the sample based on the imaging of the plurality of surface layers of the plurality of sections. The processor can be configured for generating the image of the sample based on stitching together 3D images of each of the sections.

The system can include a sample cooking system configured for irradiating the sample to increase the bulk conductivity of the sample. The sample cooking system can be configured for irradiating the sample with electrons. The irradiating electrons from the sample cooking system can have energies greater than 10 keV and sufficient to penetrate and irradiate the whole thickness of the sample. The scanning electron microscope system can include the sample cooking system.

The processor can be configured for assigning lengths of a milling step for different positions on the sample perpendicular to a normal direction to the surface of the sample based on the number of milling steps required to mill away all of the sample at the different positions.

In another aspect, a microscopy system includes a beam milling system configured for generating a beam of particles directed at a sample to irradiate the sample and to mill away successive surface layers from the sample wherein the beam of particles is directed at the sample at an angle of greater than 10 degrees to the surface of the sample, a scanning electron microscope system configured for irradiating the successive surface layers of the sample with an electron beam and for imaging the successive surface layers of the sample in response to the irradiation of the surface layer, and a processor configured for generating a three dimensional image of the sample based on the imaging of the successive layers of the sample.

Implementations can include one or more of the following features, alone or in combination with each other. For example, the beam of particles can be directed at the sample at an angle of greater than 10 degrees and less than 80 degrees to the surface of the sample. The beam of particles can be directed at the sample at an angle of greater than 20 degree and less than 45 degrees to the surface of the sample.

The scanning electron microscope system can be configured for irradiating the successive surface layers of the sample with a plurality of electron beams and for imaging the successive surface layers of the sample in response to the irradiation of the surface layer by the multiple electron beams.

The system can further include a stage supporting the sample, where the stage can be configured to rotate the sample about an axis different from an axis of the gas cluster ion beam.

The sample can be cut into a plurality of sections that are loaded onto a substrate. The beam milling system can be configured for generating a beam of particles directed at the plurality of sections to mill away successive surface layers from the sections simultaneously. The beam milling system can be configured for scanning the beam of particles over the sections. The scanning electron microscope system can be configured for irradiating the successive surface layers of the sample with a plurality of electron beams and for imaging the successive surface layers of the sample in response to the irradiation of the surface layer by the multiple electron beams. Each section can be less than 50 microns thick.

The processor can be configured for generating a three dimensional image of the sample based on the imaging of the successive layers of the sample.

The sample can be cut into a plurality of sections that each are milled into a plurality of surface layers by the beam of particles and whose plurality of surface layers are imaged in response to the irradiation by the electron beam, and the processor can be further configured for generating the three dimensional image of the sample based on the imaging of the plurality of surface layers of the plurality of sections.

The system can further include a sample cooking system configured for irradiating the sample to increase the bulk conductivity of the sample. The sample cooking system can be configured for irradiating the sample with electrons. The electrons of the sample cooking system can have energies greater than 10 keV and sufficient to penetrate and irradiate the whole thickness of the sample. The scanning electron microscope system can include the sample cooking system.

The processor can be configured for assigning lengths of a milling step for different positions on the sample perpendicular to a normal direction to the surface of the sample based on the number of milling steps required to mill away all of the sample at the different positions.

The beam of particles includes neutral gas clusters.

The scanning electron beam microscope system can include a multibeam SEM system providing a plurality of electron beams to a surface of the sample to image the surface in parallel.

BRIEF DESCRIPTION OF THE DRAWINGS

Like reference numerals in the different figures describe like elements in the different figures.

DETAILED DESCRIPTION

Disclosed herein are techniques that allow broad area milling with sufficiently spatial smoothness and with sufficiently small non-uniformity in the z-axis milling rate that is software correctable on a series of knife cut sections, so that a processor can generate a uniform voxel 3D data set, and where that 3D data from each knife cut sections can be stitched to a master 3D data set. In addition, the techniques all broad areas of a sample to be imaged with a multibeam SEM so large volumes can be imaged with high 3D spatial. In particular, a number of techniques are disclosed that address the problems of the existing art to obtain high resolution 3D isotropic scanning electron microscope data sets that can even be millimeters in thickness. The proposed techniques include: a Gas Cluster Ion Beam (GCIB) that intrinsically produces smoother surfaces than single atom ion milling; ion milling of samples at an angle combined with a rotating stage to reduce the amplitude of the milling fluctuation and to smooth the mountain and valley fluctuations to larger lateral spatial length scales; using sectioned samples that are partitioned into multiple slabs with defined z thicknesses and placed on a flat substrate, so that the thickness then limits the accumulated z position error to differential milling error times the thickness; further correcting this differential milling error by referencing to the milling endpoint surface and z-stretching voxels to reestablish the uniform slab thickness; and finally registering and stitching the plurality of slab volumetric data on a processor to reconstitute the larger original 3D thickness of the sample prior to sectioning it into slabs.

GCIB uses a beam directed at a sample to strike the sample with a non-glancing angle, where the beam includes large clusters of many atoms accelerated at an energy such that the fractional energy of each atom in the cluster is comparable to the energy required to remove an atom from a surface of the sample. Because of the low per-atom energy of the beam, the beam does not dig into the surface of the sample the way a single highly accelerated ion would. Instead, the cluster of atoms 'splats' when it hits the surface, disintegrating into many individual atoms, each with enough energy to remove one surface atom. This interaction can result in smooth milling of the surface. In some implementations, an accelerated cluster may collide with a background gas molecule along the beam path, and the collision may cause the cluster to break into two or more subclusters, where a subcluster includes one or more atoms of the original cluster. The subclusters may continue along the beam path to the sample and deposit their energy into the sample to cause the removal of atoms from the surface of the sample.

In some implementations, a neutralized ion beam can be used in place of an ion beam. That is, a gas cluster ion beam can be created and then neutralized on its way to the sample. Thus, as used herein, the terms "gas cluster ion beam" and "GCIB" refer to both beams of ionized particles and beams of neutral particles. As used herein, the term "neutral beam" refers to a beam of neutral gas clusters.

To perform GCIB-SEM, a sample can be cut into a series of sections (with each section having a thickness of, for example, about 1 micron). The sample can be stained with a heavy metal (e.g., osmium, gold, etc.) to enhance contrast during SEM imaging, and the sections can be collected on a suitably flat substrate (e.g., silicon). To avoid complications due to charging of the sample during SEM imaging, the bulk electrical conductivity of the sample sections can be increased prior to GCIB milling and SEM imaging. For example, these sample sections can be "cooked" in vacuum for several hours by irradiating the sample sections with a broad beam of high voltage electrons. The energy of the electron beam can be selected such that the beam penetrates through the whole thickness of sample. For example, for a 10 micron thick sample, a 30 keV beam could be used. This intense electron radiation can break and remake carbon bonds throughout the thickness of each section in a way that increases its bulk electrical conductivity. Other types of ionizing radiation may also be used, such as, for example, X-rays, charged particles, and non-charged particles. After this 'cooking' pretreatment, high quality electron micrographs can be obtained of the top surface of each tissue section.

After each section's top surface is SEM imaged, a Gas Cluster Ion Beam (GCIB) can be used to gently remove a layer a few nanometers thick from the surface of all of the tissue sections. In some implementations, the energy of a gas cluster in the GCIB beam can be selected such that the energy of each individual atom of a cluster in has an average energy of a bit more than the energy needed to remove an atom from the surface of a sample section. For example, clusters of 2000 argon atoms (Ar2000) can be accelerated with a 10 kV potential, such that each individual argon atom has an average energy of 5 eV, which is comparable to the eV energies of chemical or molecular binding. To create a neutral beam, an accelerated charged ion beam can be neutralized, for example, by passing the charged ion beam through an inert gas section of the beamline in which the accelerated charged ion beam picks up one or more electrons from the inert gas to neutralize the beam. Remaining charged ions can be swept out of the beam by applying a potential (e.g., between conductive plates) across the beam downstream from the location at which the charged ion beam is neutralized.

The sample sections can be oriented relative to the GCIB beam such that the beam makes a non-glancing angle (e.g., greater than 5 degrees, greater than 10 degrees, between 20 and 50 degrees) relative to the sample surface. The stage containing the sections can be rotated about an axis different from the axis of the GCIB beam during GCIB milling, such that the GCIB beam is directed at the sample from a plurality of different azimuthal angles, to reduce directional streaking and to promote uniform removal of material from the surface of the sample. Then, the freshly-revealed surface of each section can be imaged again with the SEM. This process (SEM imaging, GCIB milling, SEM imaging, GCIB milling, etc.) can be repeated until the entire depth of the sample sections has been imaged.

For example, if the GCIB milling duration is set such that 10 nm of surface material is removed between each SEM imaging step, then a total of approximately 100 cycles can be used to mill through an entire 1 micron thick section. If the SEM pixel size is also set to 10 nm, then this results in an isotropic volume dataset having 10 nm×10 nm×10 nm voxel resolution. In some implementations, all sample sections in the series can be GCIB-SEM imaged simultaneously on one large substrate and the resulting volumes can be computationally stitched into a single volume covering the entire sample.

Figure 1:
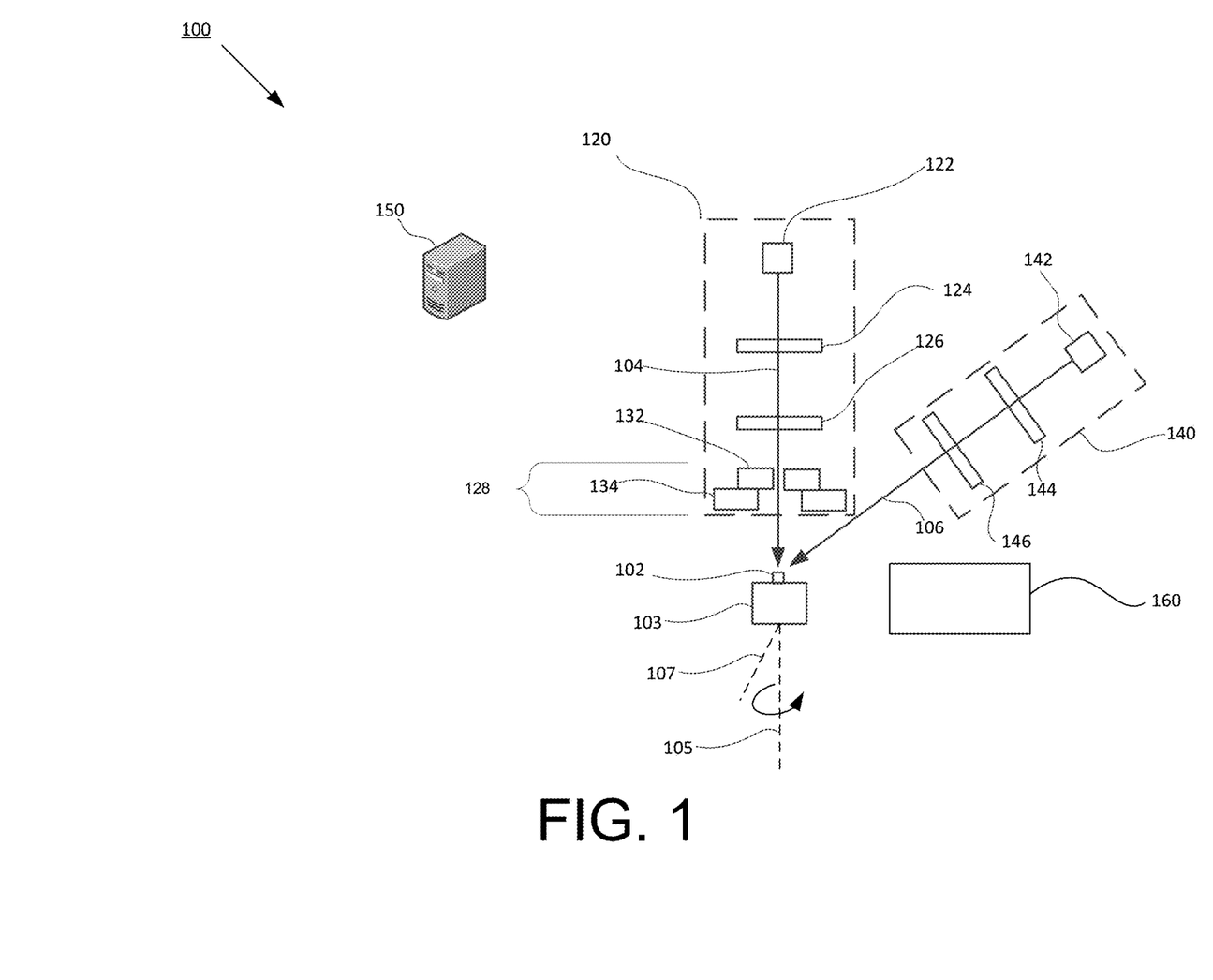
FIG. 1 is schematic diagram of a Gas Cluster Ion Beam Scanning Electron Microscopy system.

FIG. 1 is a schematic diagram of a GCIB-SEM system 100 that includes a scanning electron microscope (SEM) system 120 and a gas cluster ion beam (GCIB) system 140. The SEM system 120 includes an electron source/accelerator 122 and one or more focusing lenses 124 and one or more steering elements (e.g., conductive plates or magnetic deflectors) 126 that together produce a primary electron beam 104 that is directed to a sample 102. Backscattered electrons and/or secondary electrons emitted from the sample 102 in response to the primary electron beam 104 can be collected and imaged by a detector 128 to produce data that can be used to generate an image of the surface of the sample 102. For example, images can be generated by processing the signal collected by the detector with a processor 150 to generate an image of the sample and/or by processing the signal collected by the detector to create a 3D data set that can be used to produce an image of the sample. In some implementations, the detector 128 can include a plurality of detectors 132, 134 configured for detecting different emitted electron signals (e.g., signal electrons having different energies, for example, corresponding to backscattered or secondary electrons). The primary electron beam 104 can be rastered or scanned by the lenses 124 and steering elements 126 across the surface of the sample 102 while the backscattered and/or secondary electrons are imaged by the detector 128 to build up the image of the surface of the sample 102. The image of the sample 102 shows features of a thin layer of the surface of the sample. In one implementation, one or more detectors 128, 132, 134 can be located between the one or more lenses 124 and the sample 102, in a below-the-lens detection configuration. In one implementation, at least a portion of the one or more lenses 124 can be located between a detector and the sample 102, such that the detector is in an in-lens, or above-the-lens, detection configuration. In some implementations, one or more detectors 128, 132, 134 can be ring shaped and can be located around an axis of the SEM column. In some implementations, one or more detectors 128, 132, 134 can be located off to the side of the axis of the SEM column.

The GCIB system 140 can include a gas cluster source/accelerator 142 and one or more focusing lenses 144 and one or more steering elements (e.g., conductive plates) 146 that together produce a GCIB beam 106 that is directed toward the surface of the sample 102 and that is used to remove/ablate/mill/sputter a thin layer of the surface of the sample 102. The GCIB system can include a mass selector configured for selecting gas clusters of a particular mass for the GCIB beam. In the case of a neutral beam, the focusing, steering, and mass selection of the beam can be performed on a charged ion beam before the charged ion beam is neutralized.

The sample 102 can be supported by a stage 103 that can be rotated about an axis 105 that is neither parallel to, nor perpendicular to, the axis of the GCIB beam, while the GCIB beam is directed at the sample. In some implementations, clusters of many (e.g., hundreds or thousands of) inert gas atoms can form the clusters of the GCIB beam. The GCIB beam can be directed at a surface of the sample 102 at an angle of more than about 10° to the surface of the sample (i.e., less than 80° to the normal direction of the sample surface) or at an angle of more than about 20° to the surface of the sample (i.e., less than 70° to the normal direction of the sample surface) or at an angle of more than about 30° to the surface of the sample (i.e., less than 60° to the normal direction of the sample surface). However, the GCIB beam can strike the surface of the sample 102 at an angle greater than about 10° from a direction parallel to the surface of the sample.

In some implementations, the primary electron beam 104 and the GCIB beam 106 can be aligned at an angle between 0 and 90 degrees to each other, for example, between 10 and 80 degrees, between 20 and 70 degrees, between 30 and 60 degrees. In some implementations, the primary electron beam 104 and the GCIB beam 106 can be substantially perpendicular to each other, such that the primary electron beam strikes the sample surface in a direction normal to the surface during SEM imaging, and then, so that the GCIB beam can strike the sample at a non glancing angle during GCIB milling, the stage 103 can be tilted so that the normal direction to the surface of the sample shifts from 105 to 107.

Once the thin layer of the sample has been removed to reveal a new surface of the sample 102, the SEM system 120 can be used again to image the newly revealed surface of the sample 102. Multiple SEM images can be created of each successive surface of the sample 102 that is revealed by the GCIB beam. The process of ablation by the GCIB beam 106 and imaging by the SEM system 120 can be repeated to image additional layers of the sample 102 that are revealed after ablation of the surface of the sample by the GCIB beam 106. In this manner, a vertical stack of images of the sample 102 can be created, which then can be computationally stitched together to create a three-dimensional image of the sample 102.

In some implementations, the system 100 can include a plasma generator 160 that can create a plasma for conditioning the sample between imaging steps with the SEM system 120 or between ablation steps with the GCIB system 140. The plasma generator 160 can include a gas source (e.g., of hydrogen or oxygen) that provides molecules of a gas that is ionized by the provision of energy (e.g., the in form of microwave or radio-frequency energy, light, etc.) by the plasma generator 160 to the gas to create a plasma. The plasma can be provided to the surface of the sample, for example, by physically shuttling the sample into the plasma or by providing the plasma to the location of the sample at which the sample is imaged by the SEM system 120 and/or at which the sample is ablated by the GCIM system 140.

The plasma can interact with the surface of the sample 102 prior to an imaging step, for example, by breaking some carbon bonds between atoms on the surface layer of the sample, which can enhance the contrast of images obtained during an imaging step. In addition, the plasma can interact with the surface of the sample 102 prior to an ablation step, for example, to remove some residual "crust" due to the electron beam irradiation of the sample during an imaging step, which can allow for more uniform removal of material during an ablation step.

Figure 2A:
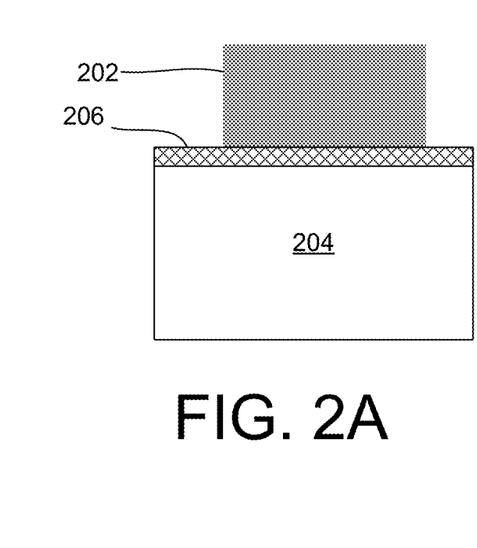
FIGS. 2A, 2B, 2C are schematic diagrams of a sample in different stages of milling.
Figure 2B:
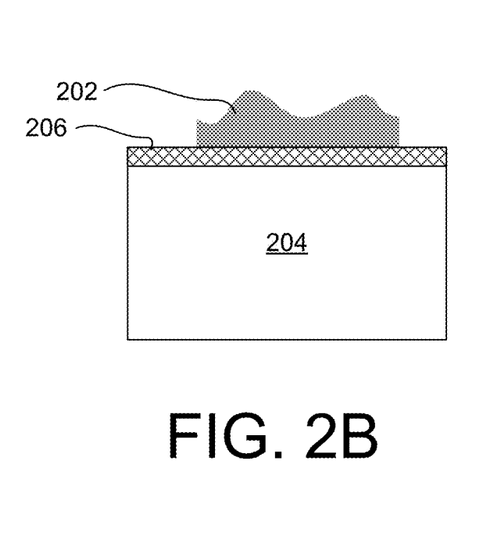
Figure 2C:
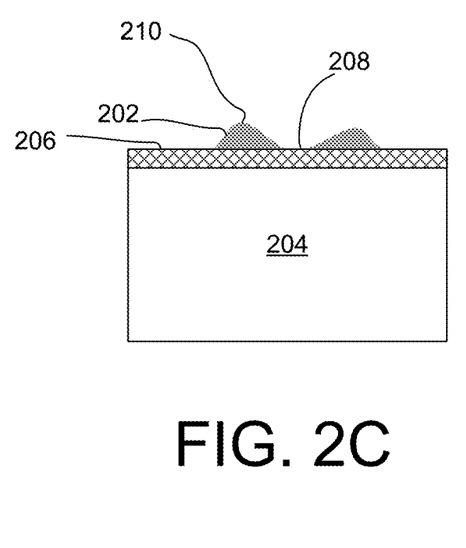

In some implementations, different portions of the sample sections can be milled at different rates in the z direction (normal to the surface of the sample sections), depending on the (x,y) locations of the portions—i.e., $\Delta z(x,y)=f(x,y)$. FIGS. 2A, 2B, 2C are schematic diagrams material being removed from a surface of a sample at different rates, depending on the (x,y) location on the sample. As shown in FIGS. 2A, 2B, 2C, a sample section 202 supported on a substrate 204 is milled in the z direction, but different portions of the sample are milled faster than others. As the layers of the sample are removed, the sample is milled from its original condition in FIG. 2A, to the configuration in 2B, to the configuration in 2C. In 3D images produced from 2D SEM images captured as the material is milled away, to correct for this differential milling rate effect, a 'flattening' algorithm can be applied to the z axis data as a function of x-y coordinate to perform a compensating stretch in z axis data to create a uniform pixel distance in the sample thickness direction. In some implementations, the surface 206 of the substrate can be coated with a high contrast material (e.g., gold), to easily indicate in the SEM image of the sample when the sample is entirely milled away at a particular x-y position, and this information can be used to apply the flattening algorithm. For example, if 91 GCIB milling cycles were required to expose the gold surface at position 208, and the sample were one micron thick, then each milling cycle can be determined to be equivalent to a 10.99 nm distance in z at position 208, and if 105 GCIB milling cycles were required to expose the gold surface at position 210, then each milling cycle can be determined to be equivalent to a 9.52 nm distance in z at position 210. Once such z corrected data slabs are determined, a sequential series of the data slabs can be registered and stacked to form a larger representation of the whole 3D sample.

An advantage of GCIB over FIB milling is that the GCIB beam can mill large areas—a broad beam of gas clusters mills the surface just as well as a focused beam. In contrast, the glancing angle FIB beam must be adjusted to maintain a sharp focus for polishing to occur. In addition to providing an improvement in reliability and ease of operation, this also allows considerably more milling flux to be delivered in a GCIB-SEM system than in a comparable FIB-SEM system, resulting in a substantial increase in milling efficiency and speed. Taken together, these attributes mean that GCIB-SEM can produce volume datasets of the same quality as FIB-SEM but without FIB-SEM's intrinsic volume limitation.

Another advantage of GCIB over FIB is the elimination of the need for periodic gallium source reheating, and an avoidance of limited lifetime issues. Many FIB-SEM systems use gallium sources to produce the sharp beams necessary for glancing angle milling, but these sources must be reheated approximately every three days of operation, necessitating the stoppage of any ongoing imaging run. Gallium source life is on the order of two months after which the gun must be partially dismantled to replace the source. These events can lead to milling inconsistencies and imperfections in the final dataset. In contrast, a GCIB gun is fed by a source of pressurized gas (e.g., argon, xenon) which, with proper facilities, need never run out. The main factor limiting continuous operation in our current system's GCIB is the ionization filament which must be replaced periodically.

Another advantage of GCIB over FIB is the relative ease of restarting after an interruption. As already mentioned, in a FIB-SEM system, the FIB beam must be positioned very precisely relative to the sample surface. This is due to the sharpness of the beam (<1 micron) and the glancing angle milling. Closed loop feedback is typically used to assist in this, but if a FIB-SEM run is stopped for an extended length of time, or if the FIB source is replaced or retuned, or if the sample itself must be temporally removed from the chamber, then it can be difficult to regain this relative positioning (in all degrees of freedom) and a 'wave' of too-thick removal is often the result. By avoiding the use of glancing angle milling, GCIB can have higher tolerance for errors in positioning. This means that even if the sample needed to be transferred from one GCIB-SEM system to a different GCIB-SEM system, it should not result in any detectable milling artifact. Also, unlike FIB-SEM, it is possible to take multiple images of a GCIB-SEM sample surface without producing a milling wave artifact (which can occur in FIB-SEM because of how the extra electron cooking interacts with the glancing angle milling). Together these advantages imply that GCIB-SEM imaging may have better overall reliability than FIB-SEM since no matter what part of a GCIB-SEM breaks it will always be possible to remove the sample from the system, repair, and then restart seamlessly.

Another advantage of GCIB-SEM over FIB-SEM is that GCIB-SEM can be compatible with multibeam SEM systems (mSEM). In an mSEM system, many electron beams (e.g., tens or hundreds) image a surface in parallel resulting in an enormous increase in imaging speed. However, this mSEM speed increase can only be realized for relatively large area samples. This means that mSEM is generally less suited to FIB-SEM, because of the small areas that can be milled by FIB techniques. However, GCIB milling can be compatible with mSEM imaging, because GCIB is able to smoothly mill even the large surfaces, and we have demonstrated that the resulting milled surfaces are compatible with secondary electron imaging, which is an imaging mode utilized within the mSEM. Furthermore, the milling efficiency offered by existing GCIB systems is sufficiently rapid to keep up with the mSEM's fast imaging rate.

Figure 3:
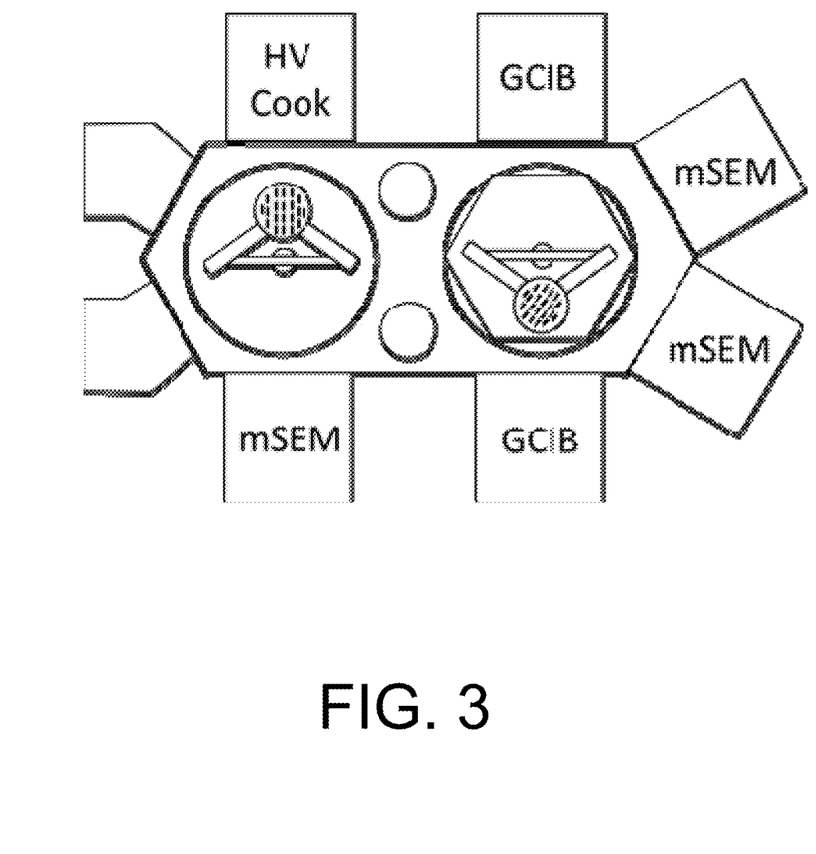
FIG. 3 is a schematic diagram of a GCIB system paired with an mSEM system.
Figure 4:
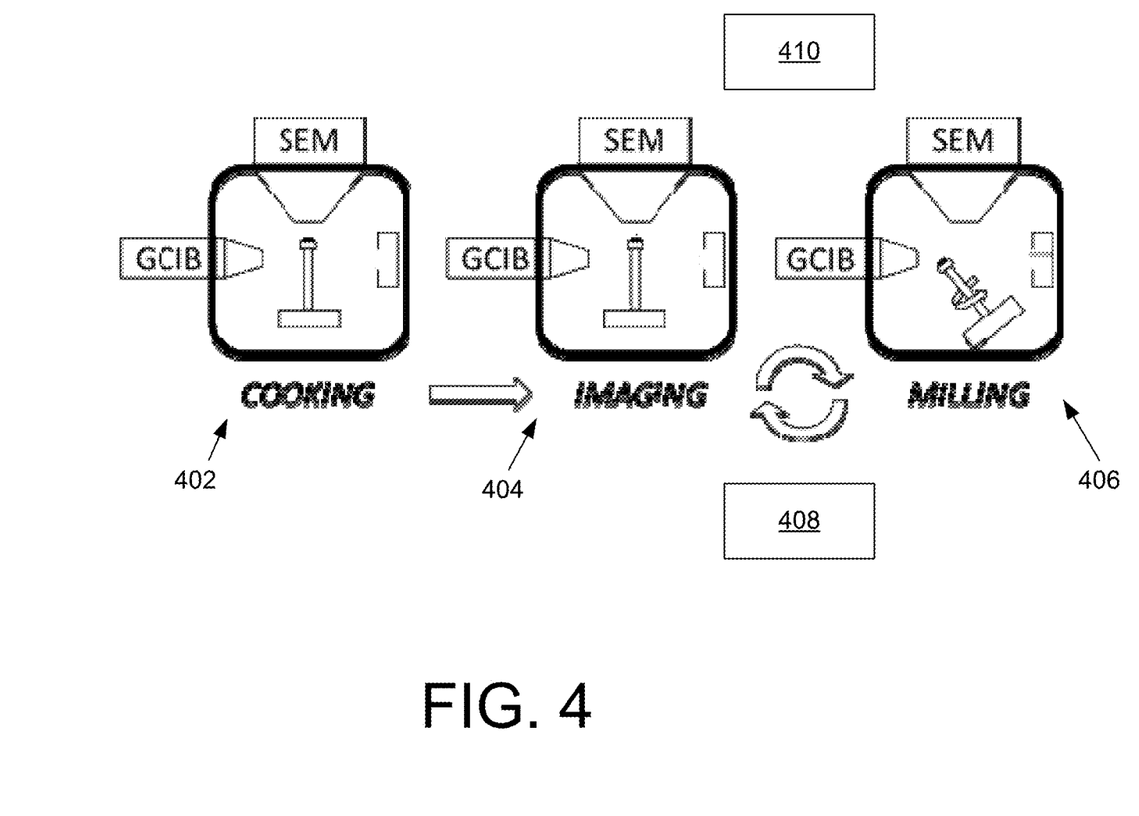
FIG. 4 is schematic diagram of a process of Gas Cluster Ion Beam Scanning Electron Microscopy.

FIG. 3 is a schematic diagram of a GCIB system paired with an mSEM and used to GCIB-SEM thousands of thick tissue sections covering the surfaces of multiple large silicon wafers. This dedicated GCIB instrument can be attached to a vacuum wafer handling system that automatically transfers wafers of thick tissue sections among multiple, redundant GCIB and mSEM stations. Such a system would allow thick sections covering large volumes (e.g., the size of a whole mouse brain) to be quickly and reliably imaged with sufficient isotropic voxel resolution for automated connectome mapping. As shown in FIG. 4, a 'HIV cook' station can provide a high current, high voltage electron flood gun instrument that can quickly irradiate an entire wafer full of thick sections to increase their bulk conductivity sufficiently to prevent charging during mSEM imaging. A 'GCIB' station can provide a high current gas cluster beam instrument that can remove the top few nanometers of tissue across all of the thick sections in a wafer. An 'mSEM' station can provide a multibeam SEM instrument that can quickly image an entire wafer of thick sections using many electron beams scanning and imaging in parallel.

FIG. 4 is schematic diagram of a process 400 of Gas Cluster Ion Beam Scanning Electron Microscopy. A sample can be irradiated with an electron beam to increase the bulk conductivity of the sample (step 402). Then, a surface of the sample can be imaged with a SEM system (step 404). Thereafter, the surface layer of the sample can be milled away by a GCIB system (step 406). Steps 404 and 406 can be repeated to successively image additional surfaces of the sample as the additional layers are exposed by successive GCIB milling steps. In some implementations, the surface of the sample can be plasma treated prior to an imaging step (step 408) or prior to a milling step (step 410). The sample sections can be oriented relative to the GCIB beam such that the beam makes a non-glancing angle (e.g., greater than 5 degrees, greater than 10 degrees, between 20 and 50 degrees) relative to the tissue surface. The stage containing the sections can be rotated during GCIB milling to reduce directional streaking and promote uniform removal.

Figure 5A:
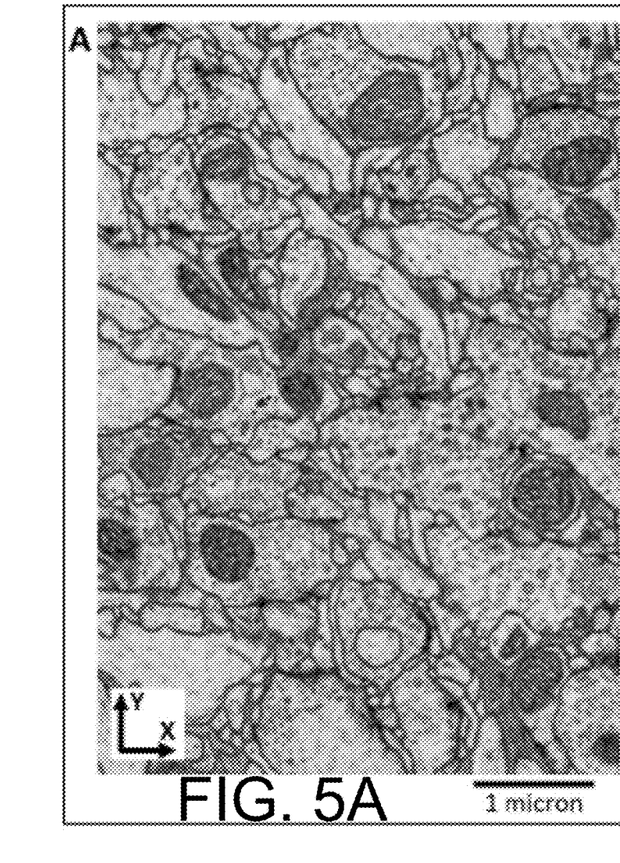
FIGS. 5A, 5B, and 5C are images generated from a GCIB-SEM volume dataset of heavy metal stained *Drosophila* neural tissue.
Figure 5B:
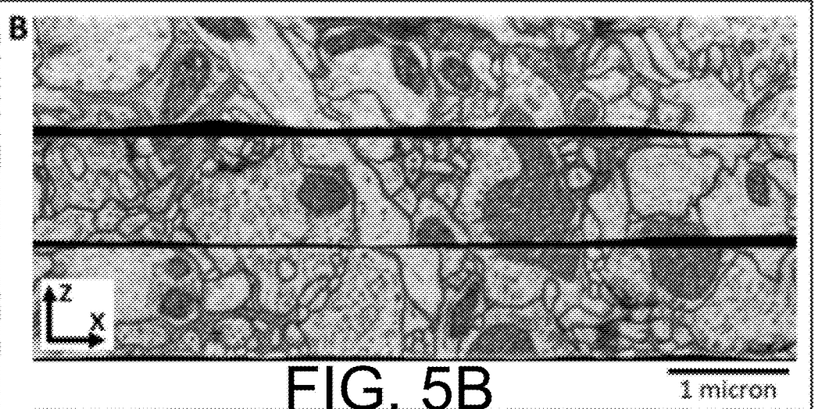
Figure 5C:
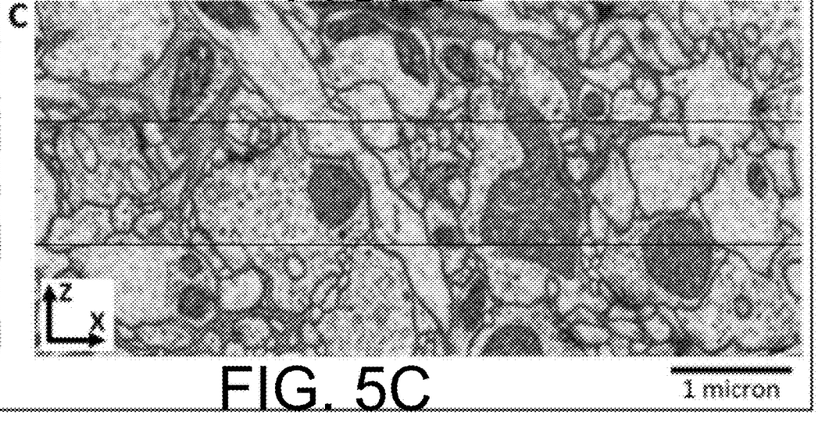
Figure 6:
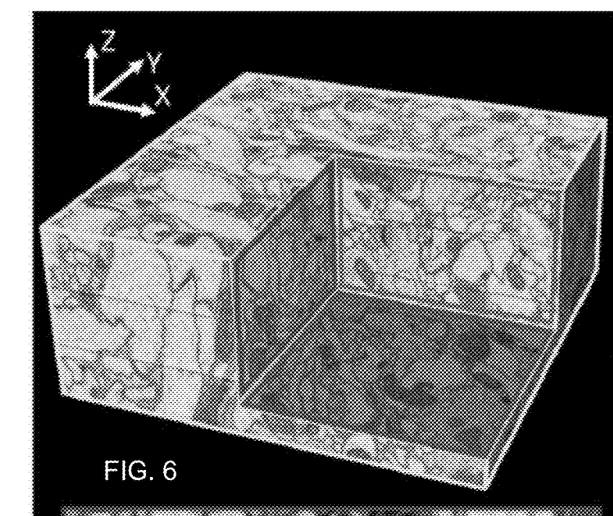
FIGS. 6, 6A, 6B, and 6C show a volumetric depiction of the GCIB-SEM *Drosophila* neural tissue dataset (the same as used for the images in FIGS. 5A, 5B, and 5C) acquired on a GCIB-SEM system.
Figure 6A:
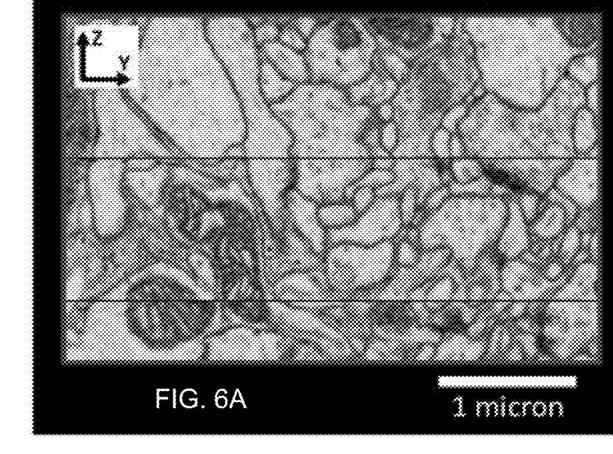
Figure 6B:
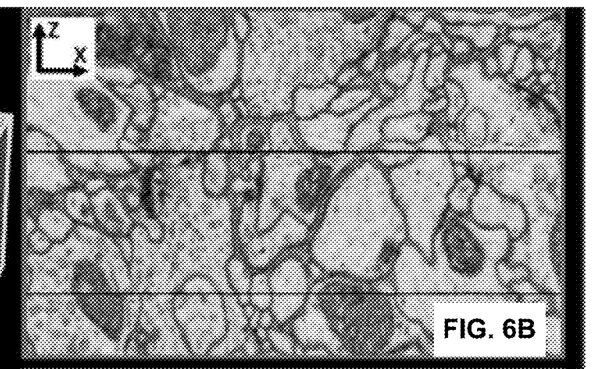
Figure 6C:
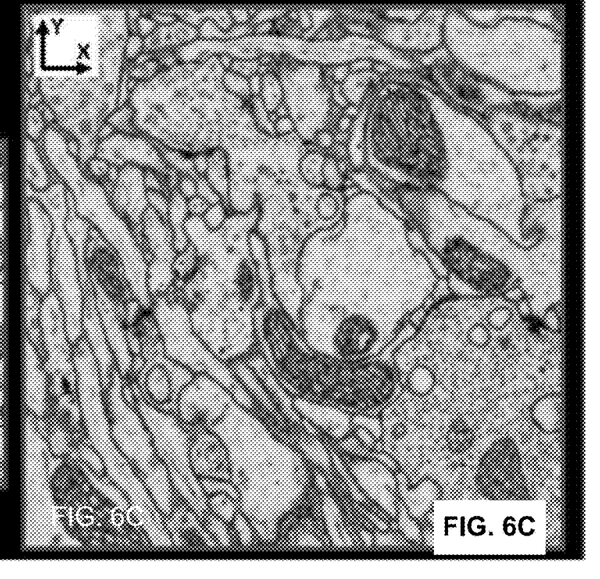

FIGS. 5a, 5b, and 5c are images generated from a GCIB-SEM volume dataset of heavy metal stained *Drosophila* neural tissue. Three sequential one micron thick sections of *Drosophila* neural tissue (embedded in Durcupan resin) were collected on a gold-coated silicon wafer and GCIB-SEM imaged to give a final volume dataset with 6.3 nm isotropic voxel resolution. FIG. 5a shows a single example image of the dataset. This image was acquired at 1.2 kV electron landing energy using secondary electron detection after many rounds of GCIB surface milling had already occurred. The volume dataset is made up of hundreds of XY-plane images like this that are later aligned to create a stack in the 'Z' direction. FIG. 5b shows an XZ-plane cross section through each of the three 1 micron thick sections. The unevenness of the bottoms of each of the sections is a result of GCIB milling rate variance between different regions of the same section. Different regions broke through to the substrate (in this case gold coated silicon that appears black in the images) at different times. FIG. 5c shows an XZ-plane cross section through same dataset after computational flattening and final alignment stitching. FIGS. 6, 6A, 6B, and 6C show a volumetric depiction of the GCIB-SEM *Drosophila* neural tissue dataset (the same as used for the images in FIGS. 5a, 5b, and 5c) acquired on a GCIB-SEM system.

Implementations of the various techniques described herein may be implemented in digital electronic circuitry, or in computer hardware, firmware, software, or in combinations of them. Implementations may be implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, solid state drives, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) or light emitting diode (LED) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback or notification, e.g., email or text message; and input from the user can be received in any form, including acoustic, speech, or tactile input, email or text message.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the implementations.

What is claimed is:

1. A microscopy system comprising:
a gas cluster beam system configured for generating a beam of gas clusters directed toward a sample to irradiate the sample and mill away successive surface layers from the sample, wherein the gas cluster beam system is configured to mill away successive surface layers from the sample until an entire depth of the sample has been milled away at a position on the sample;
a scanning electron microscope system configured for irradiating the successive surface layers of the sample with an electron beam and for imaging the successive surface layers of the sample in response to the irradiation of the surface layer; and
a processor configured for generating a three dimensional image of the sample based on the imaging of the successive layers of the sample, wherein the processor is configured for assigning lengths of a milling step for different positions on the sample perpendicular to a normal direction to the surface of the sample based on the number of milling steps required to mill away all of the sample at the different positions.

2. The system of claim 1, wherein gas clusters in the beam include more than 100 atoms per cluster.

3. The system of claim 1, wherein gas clusters in the beam include more than 1000 atoms per cluster.

4. The system of claim 1, wherein the beam of gas clusters is directed toward the sample at an angle of greater than 10 degrees to the surface of the sample.

5. The system of claim 1, wherein the beam of gas clusters is directed toward the sample at an angle of greater than 10 degrees and less than 80 degrees to the surface of the sample.

6. The system of claim 1, wherein the beam of gas clusters is directed toward the sample at an angle of greater than 20 degree and less than 45 degrees to the surface of the sample.

7. The system of claim 1, wherein the gas cluster beam system includes a vacuum system through which the beam of gas clusters is directed toward the sample, the vacuum system including residual gas molecules that, during a collision with a gas cluster of the beam of gas clusters, break the gas cluster into two or more subclusters.

8. The system of claim 1, wherein the energy of gas clusters in the beam of gas clusters is such that the average energy of an atom in a gas cluster in the beam is greater than the energy required to remove an atom from a surface layer of the sample.

9. The system of claim 1, wherein the energy of individual atoms in the gas clusters in the beam of gas clusters is between 0.2 and 20 eV.

10. The system of claim 1, wherein the energy of gas clusters in the beam of gas clusters is such that the average energy of an atom in a gas cluster in the beam is between one to five times the energy required to remove an atom from a surface layer of the sample.

11. The system of claim 1, wherein the scanning electron microscope system is configured for irradiating the successive surface layers of the sample with a plurality of electron beams and for imaging the successive surface layers of the sample in response to the irradiation of the surface layer by the multiple electron beams.

12. The system of claim 1, further comprising:
a stage supporting the sample, wherein the stage is configured to rotate the sample about an axis different from an axis of the gas cluster ion beam.

13. The system of claim 1, wherein the sample is cut into a plurality of sections that are loaded onto a substrate.

14. The system of claim 13, wherein the gas cluster ion beam system is configured for generating a beam of gas clusters for irradiating the plurality of sections to mill away successive surface layers from the sections simultaneously.

15. The system of claim 13, wherein the gas cluster ion beam system is configured for scanning the beam of gas clusters over the sections.

16. The system of claim 13, wherein the scanning electron microscope system is configured for irradiating the successive surface layers of the sample with a plurality of electron beams and for imaging the successive surface layers of the sample in response to the irradiation of the surface layer by the multiple electron beams.

17. The system of claim 13, wherein each section is less than 50 microns thick.

18. The system of claim 13, wherein the processor is configured for generating a three dimensional image of the sample based on the imaging of the successive layers of the sample.

19. The system of claim 13, wherein the beam of gas clusters includes neutral gas clusters.

20. The system of claim 13,
wherein the sample is cut into a plurality of sections that each are milled into a plurality of surface layers by the beam of gas clusters and whose plurality of surface layers are imaged in response to the irradiation by the electron beam, and
wherein the processor is further configured for generating the three dimensional image of the sample based on the imaging of the plurality of surface layers of the plurality of sections.

21. The system of claim 20, wherein the processor is configured for generating the image of the sample based on stitching together 3D images of each of the sections.

22. The system of claim 20, further comprising a sample cooking system configured for irradiating the sample to increase the bulk conductivity of the sample.

23. The system of claim 22, wherein the sample cooking system is configured for irradiating the sample with electrons.

24. The system of claim 23, wherein the electrons of the sample cooking system have energies greater than 10 keV and sufficient to penetrate and irradiate the whole thickness of the sample.

25. The system of claim 22, wherein the scanning electron microscope system includes the sample cooking system.

26. The system of claim 1, further comprising a substrate having a surface configured to support the sample, the surface being coated with a high contrast material to indicate in an image generated by the scanning electron microscope system when the sample is entirely milled away at a particular x-y position on the sample.

27. A microscopy system comprising:
a beam milling system configured for generating a beam of particles, wherein the beam of particles includes neutral gas clusters, directed at a sample to irradiate the sample and to mill away successive surface layers from the sample wherein the beam of particles is directed at the sample at an angle of greater than 10 degrees to the successive surface layers of the sample, wherein the beam milling system is configured to mill away successive surface layers from the sample until an entire depth of the sample has been milled away;
a scanning electron microscope system configured for irradiating the successive surface layers of the sample with an electron beam and for imaging the successive surface layers of the sample in response to the irradiation of the surface layer; and
a processor configured for generating a three dimensional image of the sample based on the imaging of the successive layers of the sample, wherein the processor is configured for assigning lengths of a milling step for different positions on the sample perpendicular to a normal direction to the surface of the sample based on the number of milling steps required to mill away all of the sample at the different positions.

28. The system of claim 27, wherein the beam of particles is directed at the sample at an angle of greater than 10 degrees and less than 80 degrees to the surface of the sample.

29. The system of claim 27, wherein the beam of particles is directed at the sample at an angle of greater than 20 degree and less than 45 degrees to the surface of the sample.

30. The system of claim 27, wherein the scanning electron microscope system is configured for irradiating the successive surface layers of the sample with a plurality of electron beams and for imaging the successive surface layers of the sample in response to the irradiation of the surface layer by the multiple electron beams.

31. The system of claim 27, further comprising a stage supporting the sample, wherein the stage is configured to rotate the sample about an axis different from an axis of the gas cluster ion beam.

32. The system of claim 27, wherein the sample is cut into a plurality of sections that are loaded onto a substrate.

33. The system of claim 32, wherein the beam milling system is configured for generating a beam of particles directed at the plurality of sections to mill away successive surface layers from the sections simultaneously.

34. The system of claim 32, wherein the beam milling system is configured for scanning the beam of particles over the sections.

35. The system of claim 32, wherein the scanning electron microscope system is configured for irradiating the successive surface layers of the sample with a plurality of electron beams and for imaging the successive surface layers of the sample in response to the irradiation of the surface layer by the multiple electron beams.

36. The system of claim 32, wherein each section is less than 50 microns thick.

37. The system of claim 32, wherein the processor configured for generating a three dimensional image of the sample based on the imaging of the successive layers of the sample.

38. The system of claim 27,
wherein the sample is cut into a plurality of sections that each are milled into a plurality of surface layers by the beam of particles and whose plurality of surface layers are imaged in response to the irradiation by the electron beam, and
wherein the processor is further configured for generating the three dimensional image of the sample based on the imaging of the plurality of surface layers of the plurality of sections.

39. The system of claim 27, further comprising a sample cooking system configured for irradiating the sample to increase the bulk conductivity of the sample.

40. The system of claim 39, wherein the sample cooking system is configured for irradiating the sample with electrons.

41. The system of claim 40, wherein the electrons of the sample cooking system have energies greater than 10 keV and sufficient to penetrate and irradiate the whole thickness of the sample.

42. The system of claim 39, wherein the scanning electron microscope system includes the sample cooking system.

43. The system of claim 27, wherein the scanning electron beam microscope system includes a multibeam SEM system providing a plurality of electron beams to a surface of the sample to image the surface in parallel.

44. The system of claim 27, further comprising a substrate having a surface configured to support the sample, the surface being coated with a high contrast material to indicate in an image generated by the scanning electron microscope system when the sample is entirely milled away at a particular x-y position on the sample.

* * * * *